(12) United States Patent
Wang (10) Patent No.: US 10,671,126 B2
(45) Date of Patent: Jun. 2, 2020

(54) FOLDABLE TERMINAL

(71) Applicant: Beijing Xiaomi Mobile Software Co., Ltd., Beijing (CN)

(72) Inventor: Yuwen Wang, Beijing (CN)

(73) Assignee: Beijing Xiaomi Mobile Software Co., Ltd., Beijing (CN)

(*) Notice: Subject to any disclaimer, the term of this patent is extended or adjusted under 35 U.S.C. 154(b) by 0 days.

(21) Appl. No.: 16/229,011

(22) Filed: Dec. 21, 2018

(65) Prior Publication Data

US 2020/0019215 A1 Jan. 16, 2020

(30) Foreign Application Priority Data

Jul. 16, 2018 (CN) .......................... 2018 1 0775832

(51) Int. Cl.
| | |
|---|---|
| *G06F 1/16* | (2006.01) |
| *H05K 5/00* | (2006.01) |
| *H05K 5/02* | (2006.01) |

(52) U.S. Cl.
CPC .......... *G06F 1/1656* (2013.01); *G06F 1/1618* (2013.01); *G06F 1/1679* (2013.01); *G06F 1/1681* (2013.01); *H05K 5/0017* (2013.01); *H05K 5/0226* (2013.01)

(58) Field of Classification Search
CPC .................................................... G06F 1/1679
See application file for complete search history.

(56) References Cited

U.S. PATENT DOCUMENTS

| | | | | |
|---|---|---|---|---|
| 7,583,500 | B2 * | 9/2009 | Ligtenberg | G06F 1/1616 |
| | | | | 361/147 |
| 8,705,229 | B2 * | 4/2014 | Ashcraft | G06F 1/1679 |
| | | | | 312/223.1 |
| 9,161,469 | B2 * | 10/2015 | Han | H05K 7/00 |
| 9,268,365 | B2 * | 2/2016 | Chang | G06F 1/1633 |
| | | | (Continued) | |

FOREIGN PATENT DOCUMENTS

| | | |
|---|---|---|
| CN | 105491194 A | 4/2016 |
| CN | 105677087 A | 6/2016 |
| | (Continued) | |

OTHER PUBLICATIONS

Extended Search Report for European Application No. 19167338.3 from the European Patent Office, dated Oct. 7, 2019.

(Continued)

*Primary Examiner* — Adrian S Wilson
(74) *Attorney, Agent, or Firm* — Finnegan, Henderson, Farabow, Garrett & Dunner, L.L.P.

(57) ABSTRACT

A foldable terminal includes: a first body, a second body, and a rotating shaft connecting the first body and the second body; a flexible display fixed to one side of the main body; and at least one set of first magnetic components including a first magnet and a second magnet that are attracted to each other. The first magnet is disposed at a side of the first body distal from the rotating shaft, and the second magnet is disposed on a side of the second body distal from the rotating shaft. When an angle between the first body and the second body is less than a threshold, an attraction force between the first magnet and the second magnet controls the flexible display to switch from a half-folded state to the folded state.

9 Claims, 7 Drawing Sheets

(56) References Cited

U.S. PATENT DOCUMENTS

| | | | |
|---|---|---|---|
| 2005/0236848 A1* | 10/2005 | Kim | E05C 19/16 |
| | | | 292/251.5 |
| 2007/0133156 A1* | 6/2007 | Ligtenberg | G06F 1/1616 |
| | | | 361/679.27 |
| 2008/0125195 A1* | 5/2008 | Maenpaa | H04M 1/0216 |
| | | | 455/575.3 |
| 2008/0278269 A1* | 11/2008 | Ramirez | E05C 19/16 |
| | | | 335/205 |
| 2009/0091512 A1* | 4/2009 | Jung | G06F 1/1601 |
| | | | 345/1.1 |
| 2009/0103261 A1* | 4/2009 | Shih | E05C 19/16 |
| | | | 361/679.58 |
| 2010/0238620 A1* | 9/2010 | Fish | G06F 1/1616 |
| | | | 361/679.09 |
| 2013/0227836 A1* | 9/2013 | Whitt, III | H01H 13/704 |
| | | | 29/622 |
| 2013/0329359 A1* | 12/2013 | Andre | G06F 1/1616 |
| | | | 361/679.55 |
| 2014/0011548 A1* | 1/2014 | Varela | H04B 1/3888 |
| | | | 455/566 |
| 2016/0278222 A1 | 9/2016 | Lee | |
| 2017/0208157 A1 | 7/2017 | Kim et al. | |
| 2018/0364761 A1* | 12/2018 | Lin | H04M 1/0216 |
| 2019/0086966 A1 | 3/2019 | Lin et al. | |

FOREIGN PATENT DOCUMENTS

| | | |
|---|---|---|
| CN | 206547121 U | 10/2017 |
| CN | 207184560 U | 4/2018 |
| EP | 3 396 929 A1 | 10/2018 |
| KR | 20170069115 A | 6/2017 |
| RU | 2454821 C2 | 6/2012 |
| WO | WO 2017114460 A1 | 7/2017 |

OTHER PUBLICATIONS

First Office Action for Russian Patent Application No. 2019123983_07, dated Mar. 26, 2020.

* cited by examiner

FOLDABLE TERMINAL

CROSS-REFERENCE TO RELATED APPLICATIONS

This application is based on and claims priority of Chinese Patent Application No. 201810775832.9, filed on Jul. 16, 2018, which is incorporated herein by reference in its entirety.

TECHNICAL FIELD

The present disclosure generally relates to the field of computer technology, and more particularly to a foldable terminal.

BACKGROUND

A flexible display has a foldable function, which makes a terminal equipped with the flexible display able to be folded.

In the related art, a terminal equipped with a flexible display is generally equipped with a mechanical structure such as a rotating shaft, and the folding and unfolding of the terminal is realized by a plurality of moving structures in the rotating shaft.

SUMMARY

In order to overcome the problem existing in the related art, the present disclosure provides a foldable terminal.

According to a first aspect of an embodiment of the present disclosure, there is provided a foldable terminal, including: a main body including a first body, a second body, and a rotating shaft connecting the first body and the second body; a flexible display fixed to one side of the main body; and at least one set of first magnetic components including a first magnet and a second magnet that are attracted to each other. The first magnet is disposed on a side of the first body distal from the rotating shaft, the second a magnet is disposed on a side of the second body distal from the rotating shaft; and when the flexible display is in a folded state, positions of the first magnet and the second magnet in each set of first magnetic components are opposite to each other. When an angle between the first body and the second body is less than a threshold, an attraction force between the first magnet and the second magnet controls the flexible display to switch from a half-folded state to the folded state.

The technical solution provided by the embodiments of the present disclosure may include the following beneficial effects.

In the foldable terminal provided by the present disclosure, the folding of the terminal is realized through the attraction force between the first magnetic components, instead of through the moving structure in the rotating shaft. In this way, it can simplify the design of the rotating shaft, avoid jamming fault caused by the manufacturing tolerance of the moving structure, and improve the success rate of the folding.

When the angle between the first body and the second body is less than the threshold, the attraction force controls the flexible display to be automatically switched from a half-folded state to a folded state, which does not require manual folding by the user in the process. Therefore, the first magnetic components can provide assistance during the folding process of the terminal, and avoid the problem that the user needs to exert force in the whole process when the terminal is folded or unfolded through the mechanical structure such as the rotating shaft, thereby improving the user experience.

It should be understood that both the foregoing general description and the following detailed description are exemplary and explanatory only and are not restrictive of the disclosure.

BRIEF DESCRIPTION OF THE DRAWINGS

The accompanying drawings, which are incorporated in and constitute a part of this specification, illustrate embodiments consistent with the disclosure and, together with the description, serve to explain the principles of the disclosure.

DETAILED DESCRIPTION

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations consistent with the disclosure. Instead, they are merely examples of apparatuses and methods consistent with aspects related to the disclosure as recited in the appended claims.

Figure 1:
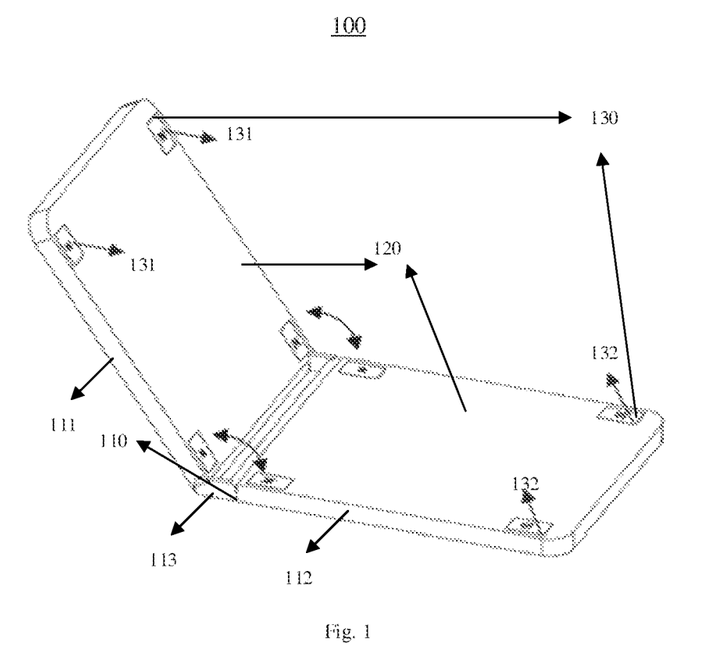
FIG. 1 is a schematic diagram of a foldable terminal according to an exemplary embodiment.

FIG. 1 is a schematic diagram of a foldable terminal 100 according to an exemplary embodiment. As shown in FIG. 1, the terminal 100 may include: a main body 110 including a first body 111, a second body 112, and a rotating shaft 113 connecting the first body 111 and the second body 112; a flexible display 120 fixed to one side of the main body 110; and at least one set of first magnetic components 130.

The first magnetic components 130 include a first magnet 131 and a second magnet 132 that are attracted to each other. The first magnet 131 is disposed on a side of the first body 111 distal from the rotating shaft 113, and the second magnet 132 is disposed on a side of the second body 112 distal from the rotating shaft 113. When the flexible display 120 is in a folded state, the positions of the first magnet 131 and the second magnet 132 in each set of the first magnetic components 130 are opposite to each other.

When an angle between the first body 111 and the second body 112 is less than a threshold, an attraction force between the first magnet 131 and the second magnet 132 may control the flexible display 120 to be switched from a half-folded state to a folded state.

The half-folded state refers to a state in which the angle between the first body 111 and the second body 112 is greater than 0° and less than 90°; and the folded state refers to a complete folded state or a substantially complete folded state. In the complete folded state, the angle between the first body 111 and the second body 112 is equal to 0°, and in the substantially complete folded state, the angle between the first body 111 and the second body 112 is substantially equal to 0°, that is, the angle is in a range between 0° and a small angle.

In FIG. 1, as an example, two sets of first magnetic components 130, with the first magnet 131 being a north polarity (N), and the second magnet 132 being a south polarity (S) are illustrated.

Through the foldable terminal 100 provided by the present disclosure, the folding of the terminal is realized through the attraction force between the first magnetic components, instead of through the moving structure in the rotating shaft. In this way, it can simplify the design of the rotating shaft, avoid jamming fault caused by the manufacturing tolerance of the moving structure, and improve the success rate of the folding.

When the angle between the first body and the second body is less than the threshold, the attraction force may control the flexible display to be automatically switched from a half-folded state to a folded state, which does not require manual folding by the user in the process. Therefore, the first magnetic components can provide assistance during the folding process of the terminal, and avoid the problem that the user needs to exert force in the whole process when the terminal is folded through the mechanical structure such as the rotating shaft, thereby improving the user experience.

Figure 2:
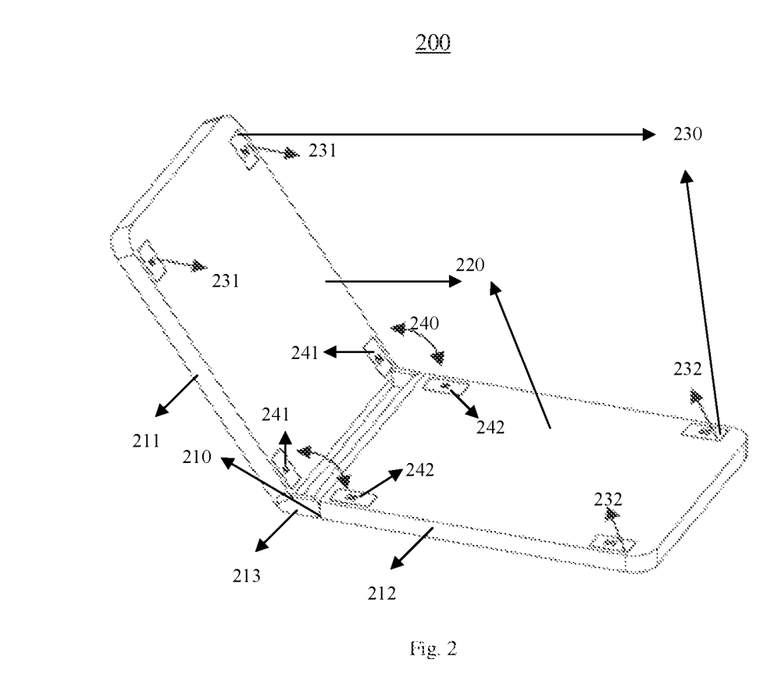
FIG. 2 is a schematic diagram of a foldable terminal according to an exemplary embodiment.

FIG. 2 is a schematic diagram of a foldable terminal 200 according to an exemplary embodiment. As shown in FIG. 2, the terminal 200 may include: a main body 210 including a first body 211, a second body 212, and a rotating shaft 213 connecting the first body 211 and the second body 212.

The main body 210 includes components of the terminal 200 other than the flexible display 220. The outer portion of the main body 210 may be covered with a back cover. The internal portion may include a main board, a battery, an antenna, a rear camera, and the like in the terminal 200. The main body 210 is not limited in this embodiment.

With respect to the rotating shaft 213, the main body 210 may be divided into two parts, one of which is referred to as the first body 211, and the other is referred to as the second body 212. The components inside the main body 210 are distributed in the first body 211 and the second body 212, which is not limited in this embodiment. For illustrative purpose only, the body on the left side in FIG. 2 is referred to as the first body 211, and the body on the right side is referred to as the second body 212.

A function of the rotating shaft 213 in this embodiment is to connect the first body 211 and the second body 212, and the folding and unfolding of the terminal 200 are not required to be mechanically realized by a plurality of moving structures. Therefore, the design of the rotating shaft 213 in this embodiment is relatively simple, and there may be no jamming problems caused by manufacturing tolerance. In this way, it can ensure the success rate of folding and unfolding, and also improve the user experience of folding and unfolding. In addition, since the rotating shaft 213 in the embodiment does not need to include a plurality of moving structures, the size of the rotating shaft 213 can be reduced, thereby improving the aesthetic appearance of the terminal; and the manufacturing cost of the rotating shaft 213 can also be reduced.

The terminal 200 may further include a flexible display 220 fixed to one side of the main body 210. Specifically, the flexible display 220 is fixed on a side of the main body 210 opposite to the back cover. The entire screen of the flexible display 220 in this embodiment covers one side of the main body 210, and when the flexible display 220 is in an unfolded state, the entire screen presents the display effect.

The terminal 200 may further include at least one set of first magnetic components 230. The first magnetic components 230 include a first magnet 231 and a second magnet 232 that are attracted to each other. The first magnet 231 is disposed on a side of the first body 211 distal from the rotating shaft 213. The second magnet 232 is disposed on a side of the second body 212 that is distal from the rotating shaft 213.

The first magnet 231 and the second magnet 232 being attracted to each other mean that the magnetic polarity of the first magnet 231 on the side proximate to the flexible display 220 is opposite to the magnetic polarity of the second magnet 232 on the side proximate to the flexible display 220. For illustrative purpose only, the magnetic polarity of the first magnet 231 refers to the magnetic polarity of the first magnet 231 on the side proximate to the flexible display 220, and the magnetic polarity of the second magnet 232 refers to the magnetic polarity of the second magnet 231 on the side proximate to the flexible display 220.

The magnetic properties of the first magnet 231 and the second magnet 232 are indicated on the flexible display 220 in FIG. 2, and as an example for illustration, the magnetic property of the first magnet 231 is north and the magnetic property of the second magnet 232 is south in FIG. 2. In another embodiment, the magnetic property of the first magnet 231 may be set to south, and the magnetic property of the second magnet 232 may be set to north, which is not limited in this embodiment.

The distance between the first magnet 231 and the rotating shaft 213 and the distance between the second magnet 232 and the rotating shaft 213 are equal, such that when the flexible display 220 is in the folded state, the positions of the first magnet 231 and the second magnets 232 in each set of the first magnetic components 230 are opposite to each other. In this way, the attraction force between the first magnet 231 and the second magnet 232 is parallel to a side edge of the terminal 200, and the terminal 200 can be controlled to be folded along the direction of the side edge, so that the folded terminal has a more square shape and is convenient to be carried.

A magnetic isolation sheet may be disposed between the first magnet 231 and the second magnet 232 in each set of the first magnetic components 230. The magnetic isolation sheet is configured to gather the magnetic induction lines, and the more the magnetic induction lines are gathered, the larger the magnetic force will be. Therefore, the attraction force between the first magnet 231 and the second magnet 232 can be increased.

The magnitude of the magnetic force of the first magnet 231 and the second magnet 232 and the distance between the first magnet 231 and the rotating shaft 213 relate to the torque of attraction force, as described in detail below.

Since the first magnet 231 and the second magnet 232 are symmetrical with respect to the rotating shaft 213, the selection of the position of only the first magnet 231 will be described below as an example. After the distance between the first magnet 231 and the rotating shaft 213 is determined, a straight line may be determined in the first body 211 having that distance from the rotating shaft 213. Then, the first magnet 231 may be disposed on the straight line. When the terminal 200 includes one set of first magnetic components 230, the first magnet 231 may be disposed at a midpoint of the straight line. When the terminal includes at least two sets of the first magnetic components 230, the at least two first magnets 231 may be evenly arranged on the straight line.

It should be noted that when the terminal 200 includes at least two sets of first magnetic components 230, the magnetic properties of all the first magnets 231 are the same; or the magnetic properties of some of the first magnets 231 may be the same, and the magnetic properties of some of the first magnets 231 are different, which is not limited in this embodiment.

The terminal 200 may further include at least one set of second magnetic components 240. The second magnetic components 240 include a third magnet 241 and a fourth magnet 242 that are repulsive to each other. The third magnet 241 is disposed on a side of the first body 211 proximate to the rotating shaft 213. The second magnet 242 is disposed on a side of the second body 212 proximate to the rotating shaft 213. When the flexible display 220 is in the folded state, the third magnet 241 and the fourth magnet 242 are in an overlapping positional relationship.

The third magnet 241 and the fourth magnet 242 being repulsive to each other mean that the magnetic polarity of the third magnet 241 on the side proximate to the flexible display 220 is the same as the magnetic polarity of the fourth magnet 242 on the side proximate to the flexible display 220. For illustrative purpose only, the magnetic polarity of the third magnet 241 refers to the magnetic polarity of the third magnet 241 on the side proximate to the flexible display 220, and the magnetic polarity of the fourth magnet 242 refers to the magnetic polarity of the fourth magnet 242 on the side proximate to the flexible display 220.

The magnetic properties of the third magnet 241 and the fourth magnet 242 are indicated on the flexible display 220 in FIG. 2, and in FIG. 2, the magnetic property of the third magnet 241 is the north and the magnetic property of the fourth magnet 242 is the north as an example. In another embodiment, the magnetic property of the third magnet 241 may be set as the south, and the magnetic property of the fourth magnet 242 may be set as the south, which is not limited in this embodiment.

The distance between the third magnet 241 and the rotating shaft 213 and the distance between the fourth magnet 242 and the rotating shaft 213 are equal, such that when the flexible display 220 is in the folded state, the positions of the third magnet 241 and the fourth magnets 242 in each set of the second magnetic components 240 are opposite to each other. In this way, the repulsion force between the third magnet 241 and the fourth magnet 242 is parallel to the side edge of the terminal 200, and the terminal 200 can be controlled to be unfolded along the direction of the side edge, so that the shape of the unfolded terminal is relatively square and convenient for use.

A magnetic isolation sheet may be disposed between the third magnet 241 and the fourth magnet 242 in each set of the second magnetic components 240. The magnetic isolation sheet is configured to gather the magnetic induction lines, and the more the magnetic induction lines are gathered, the larger the magnetic force will be. Therefore, the repulsion force between the third magnet 241 and the fourth magnet 242 can be increased.

The magnitude of the magnetic force of the third magnet 241 and the fourth magnet 242 and the distance between the third magnet 241 and the rotating shaft 213 relate to the torque of the repulsion force, as described in detail below.

Since the third magnet 241 and the fourth magnet 242 are symmetrical with respect to the rotating shaft 213, the selection of the position of only the third magnet 241 will be described below as an example. After the distance between the third magnet 241 and the rotating shaft 213 is determined, a straight line may be determined in the first body 211 having that distance from the rotating shaft 213, and the third magnet 241 may be disposed on the straight line. When the terminal includes one set of second magnetic components 240, the third magnet 241 may be disposed at a midpoint of the straight line. When the terminal includes at least two sets of the second magnetic components 240, the at least two third magnets 241 may be evenly arranged on the straight line.

It should be noted that when the terminal 200 includes at least two sets of second magnetic components 240, the magnetic properties of all the third magnets 241 are the same; or the magnetic properties of some of the third magnets 241 may be the same, and the magnetic properties of some of the third magnets 241 are different, which is not limited in the present disclosure.

In this embodiment, when the angle between the first body 211 and the second body 212 is less than a threshold, the torque of attraction force between the first magnet 231 and the second magnet 232 is greater than that of the repulsion force between the third magnet 241 and the fourth magnet 242, and the flexible display 220 is switched from the half-folded state to the folded state. When the angle between the first body 211 and the second body 212 is greater than the threshold, the torque of attraction force is less than the torque of the repulsion force, and the flexible display 220 is switched from the half-folded state to the unfolded state.

The torque is equal to a product of the force and the force arm, and is used to indicate the effect of the force on the rotation of an object. In this embodiment, for the first magnetic component 230, the magnetic forces of the first magnet 231 and the second magnet 232 can be adjusted, which is equivalent to adjusting the magnetic flux to adjust the force of the torque. The distance between the first magnet 231 and the rotating shaft 213 can also be adjusted, so as to adjust the force arm of the torque, in order to achieving the adjustment of the torque of the attraction force. Similarly, for the second magnetic component 240, the magnetic forces of the third magnet 241 and the fourth magnet 242 can be adjusted, that is, the magnetic flux is adjusted to adjust the force of the torque. The distance between the third magnet 241 and the rotating shaft 213 can also be adjusted, so as to adjust the force arm of the torque, in order to achieving the adjustment of the torque of the repulsion force.

In this embodiment, when the flexible display 220 is automatically switched from the half-folded state to the folded state, if the torque of attraction force is too large, a sharp collision between the first body 211 and the second body 212 may occur when they are to be completely folded, thus destroying the terminal. When the flexible display 220 is automatically switched from the half-folded state to the unfolded state, if the torque of the repulsion force is too large, the flexible display 220 may be reversely folded when being unfolded, which may damage the flexible display 220. Therefore, it may be necessary to adjust the torque of attraction force and the torque of repulsion force according to empirical values, which can not only protect the terminal but also achieve an excellent user experience in the hand.

It should be noted that when the angle is equal to the threshold, the torque of attraction force is equal to the torque of the repulsion force, and the terminal is in a stationary state. It can be seen that the threshold is the degree of the angle between the first body 211 and the second body 212 when the torque of the attraction force is balanced with the torque of the repulsion force, and may be an empirical value or an experimental value, which is not limited in this embodiment.

In the present embodiment, the half-folded state refers to a state in which the angle between the first body 211 and the second body 212 is greater than 0° and less than 90°, that is, the state shown in FIG. 2. The folded state refers to a complete folded state and a substantially complete folded state. The angle between the first body 211 and the second body 212 when being in complete folded state is equal to 0°, that is, the state shown in FIG. 3. The angle between the first body 211 and the second body 212 when being in a substantially complete folded state is equal to about 0°, that is, the angle is between 0° and a small angle. The unfolded state means that the angle between the first body 211 and the second body 212 is greater than 90° and less than 180°.

Figure 4:
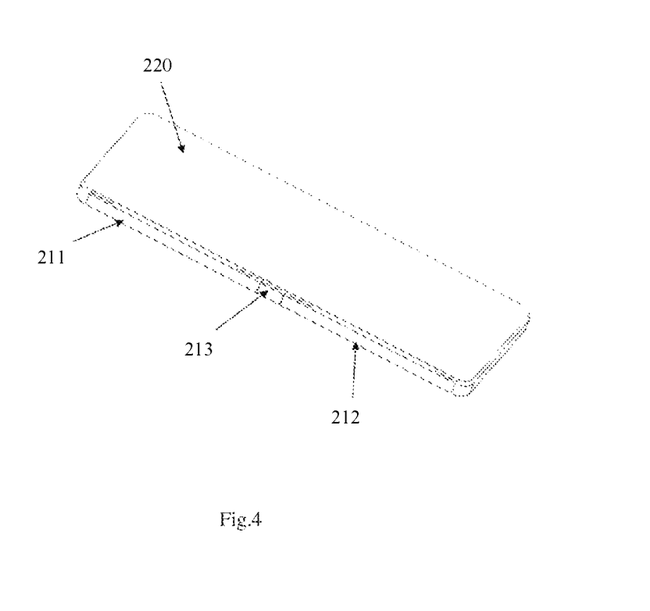
FIG. 4 is a schematic diagram of a foldable terminal according to an exemplary embodiment.
Figure 5:
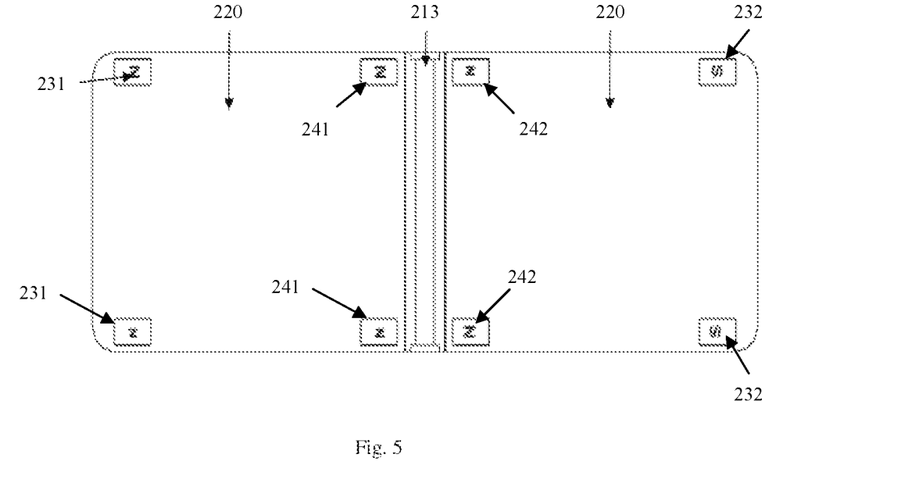
FIG. 5 is a schematic diagram of a foldable terminal according to an exemplary embodiment.

In exemplary embodiments, when the angle between the first body 211 and the second body 212 is greater than 90° and less than 180°, it may also be necessary to switch the flexible display 220 from the unfolded state to the complete unfolded state. The complete unfolded state refers to a state in which the angle between the first body 211 and the second body 212 is equal to 180°, that is, the state shown in FIGS. 4 and 5. FIG. 4 is a side view thereof, and FIG. 5 is a front view thereof, and the angle between the first body 211 and the second body 212 in FIGS. 4 and 5 is 180°.

Figure 6:
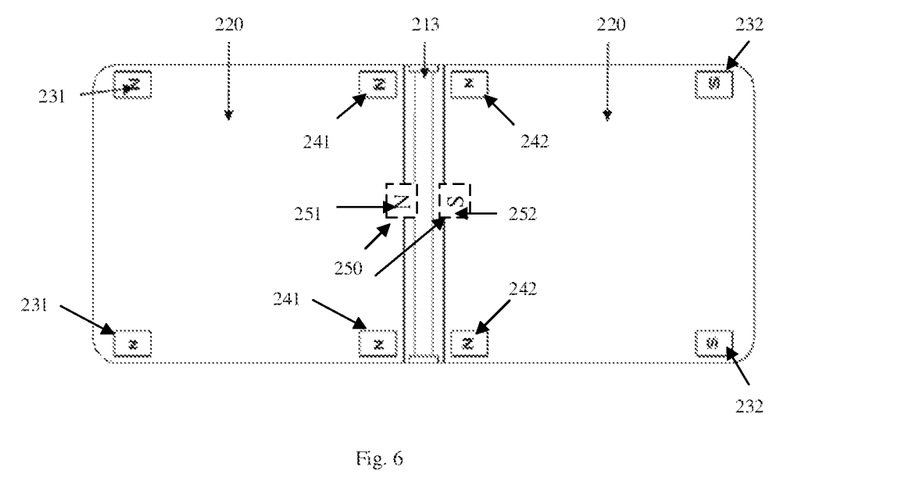
FIG. 6 is a schematic diagram of a foldable terminal according to an exemplary embodiment.

In exemplary embodiments, shown in FIG. 6, the terminal further includes at least one set of third magnetic components 250. The third magnetic component 250 includes a fifth magnet 251 and a sixth magnet 252 that are attracted to each other. The fifth magnet 251 is disposed in the first body 211 on a side opposite to the flexible display 220 and proximate to the rotating shaft 213. The sixth magnet 252 is disposed in the second body 212 on a side opposite to the flexible display 220 and proximate to the rotating shaft 213. When the flexible display 220 is in the unfolded state, the flexible display 220 can be switched from the unfolded state to the complete folded state under the control of the torque of the attraction force between the fifth magnet 251 and the sixth magnet 252.

In exemplary embodiments, when the flexible display 220 is disposed at one side of the main body 210, the fifth magnet 251 and the sixth magnet 252 are disposed on the other side of the main body 210, and both of the fifth magnet 251 and the sixth magnet 252 are disposed proximate to the rotating shaft 213.

The fifth magnet 251 and the sixth magnet 252 being attracted to each other mean that the magnetic polarity of the fifth magnet 251 on the side proximate to the rotating shaft 213 is opposite to the magnetic polarity of the sixth magnet 252 on the side proximate to the rotating shaft 213. For illustrative purpose only, the magnetic polarity of the fifth magnet 251 refers to the magnetic polarity of the fifth magnet 251 on the side proximate to the rotating shaft 213, and the magnetic polarity of the sixth magnet 252 refers to the magnetic polarity of the sixth magnet 252 on the side proximate to the rotating shaft 213.

The distance between the fifth magnet 251 and the rotating shaft 213 and the distance between the sixth magnet 252 and the rotating shaft 213 are equal, such that when the flexible display 220 is in the complete unfolded state, the positions of the fifth magnet 251 and the sixth magnet 252 in each set of the third magnetic components 250 are opposite to each other. In this way, the attraction force between the fifth magnet 251 and the sixth magnet 252 is parallel to the side edge of the terminal, and the terminal can be controlled to be unfolded along the direction of the side edge, so that the shape of the folded terminal is relatively square and convenient for use.

A magnetic isolation sheet may be disposed between the fifth magnet 251 and the sixth magnet 252 in each set of the third magnetic components 250. The magnetic isolation sheet is configured to gather the magnetic induction lines, and the more the magnetic induction lines are gathered, the larger the magnetic force will be. Therefore, the attraction force between the fifth magnet 251 and the sixth magnet 252 can be increased.

Referring to FIG. 6, it shows a schematic diagram of the fifth magnet 251 and the sixth magnet 252. In FIG. 6, it is illustrated as an example, the magnetic polarity of the fifth magnet 251 is north, and the magnetic polarity of the sixth magnet 252 is south. Since both of the magnet 251 and the sixth magnet 252 are disposed on the back side of the flexible display 220, the fifth magnet 251 and the sixth magnet 252 are indicated by broken lines in FIG. 6. In another embodiment, the magnetic properties of the fifth magnet 251 can be set as the south, and the magnetic properties of the sixth magnet 252 can be set as the north, which is not limited in this embodiment.

It should be noted that when the terminal includes at least two sets of the third magnetic components 250, the magnetic properties of all the fifth magnets 251 are the same; or the magnetic properties of some of the fifth magnets 251 may be the same, and the magnetic properties of some of the fifth magnets 251 are different, which is not limited in the present disclosure.

In the related art, the folding and unfolding of a terminal is realized by a mechanical structure such as a rotating shaft. In this process, the terminal stops at a position where the user stops the force, and there is no assistant power, resulting in poor user experience. In the illustrated embodiments, magnetic components are used to assist to fold and unfold the terminal, which can enhance the user experience. In addition, when the folding and unfolding of the terminal is realized by a mechanical structure such as a rotating shaft, the terminal may not be completely folded or completely unfolded due to the problem of the mechanical structure, thereby affecting the user experience. In the illustrated embodiments, the first magnetic component 230 can ensure that the terminal is completely folded, and the third magnetic component 250 can ensure that the terminal is completely unfolded, thereby improving the user experience.

Figure 3:
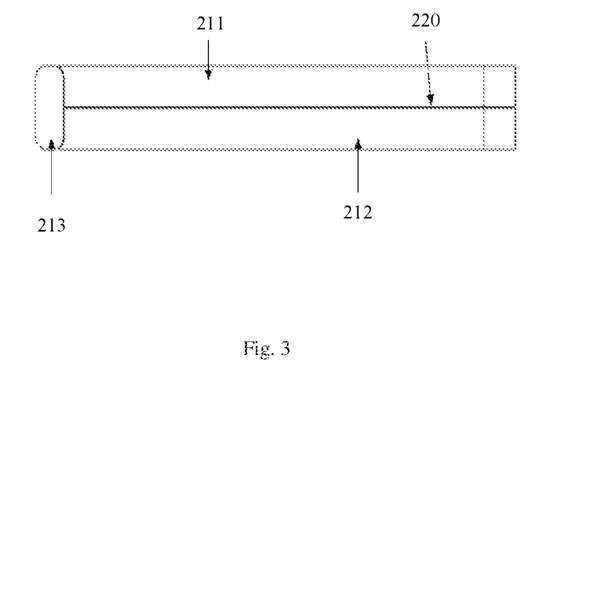
FIG. 3 is a schematic diagram of a foldable terminal according to an exemplary embodiment.

In the illustrated embodiments, when the main body 210 includes one first body 211 and one second body 212, the sizes of the first body 211 and the second body 212 may be equal or different, which is not limited in the present disclosure. The sizes of the first body 211 and the second body 212 being equal mean that the length and width of the first body 211 are respectively equal to length and width of the second body 212. Referring to FIG. 3, in that embodiment, the size of the folded terminal is half of the size of the unfolded terminal.

Figure 7:
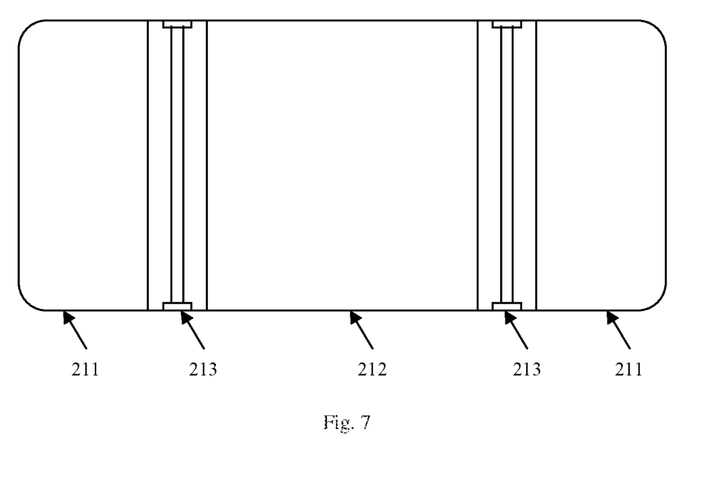
FIG. 7 is a schematic diagram of a foldable terminal according to an exemplary embodiment.

In one embodiment, when the main body 210 includes two first bodies 211, the two first bodies 211 are respectively disposed at two ends of the second body 212, as shown in FIG. 7.

In this embodiment, when the main body 210 includes two first bodies 211, the sum of the sizes of the two first bodies 211 may be larger than the size of the second body 212, or may be smaller than the size of the second body 212, or may be equal to the size of the second body 212. The sum of the sizes of the two first bodies 211 being equal to the size of the second body 212 means that each of the widths of the two first bodies 211 is equal to the width of the second body 212 and the sum of the lengths of the two first bodies 211 are equal to the length of the second body 212.

Figure 8:
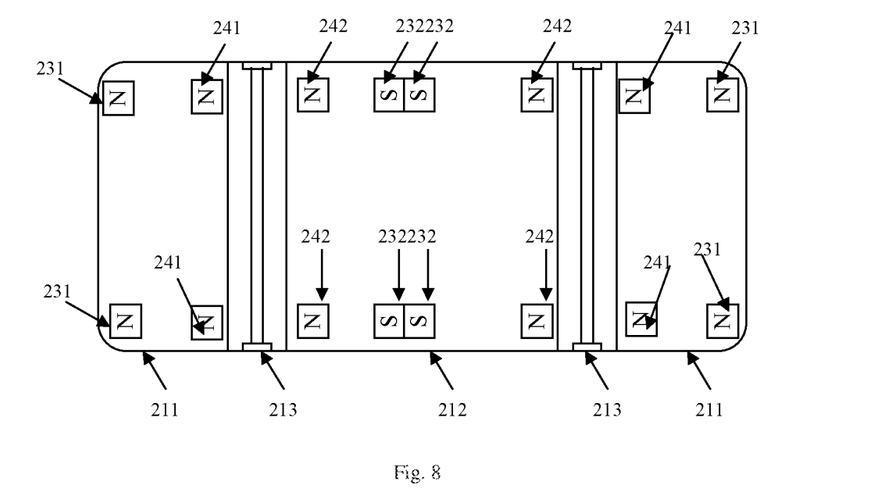
FIG. 8 is a schematic diagram of a foldable terminal according to an exemplary embodiment.
Figure 9:
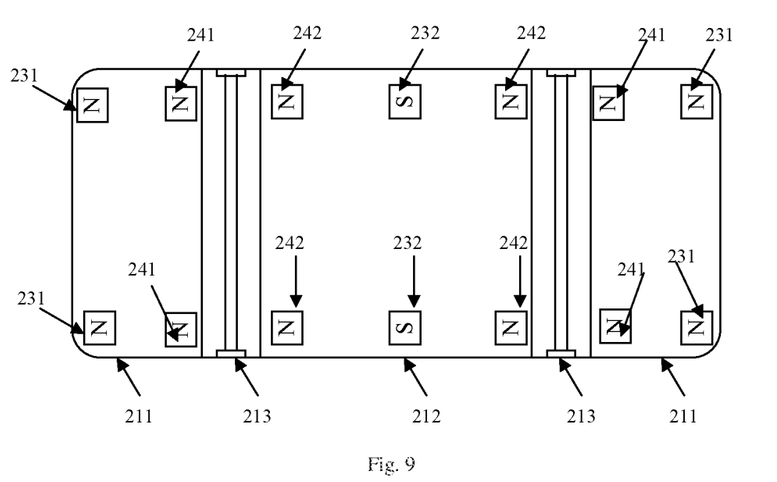
FIG. 9 is a schematic diagram of a foldable terminal according to an exemplary embodiment.

When the sum of the sizes of the two first bodies 211 is equal to the size of the second body 212, the sizes of the two first bodies 211 may be unequal or equal. When the sizes of the two first bodies 211 are equal, the size of each of the two first bodies 211 is half of the size of the second body 212. Referring to FIGS. 8 and 9, the two sets of first magnetic components 230 in FIG. 8 do not share one second magnet 232, and the two sets of first magnetic components 230 in FIG. 9 share one second magnet 232.

Through the foldable terminal provided by the present disclosure, the folding and unfolding of the terminal is realized respectively through the attraction force between the first magnetic components and the repulsion force between the second magnetic components, instead of through the moving structure in the rotating shaft. In this way, it can simplify the design of the rotating shaft, avoid jamming fault caused by the manufacturing tolerance of the moving structure, and improve the success rate of the folding and unfolding.

When the angle between the first body and the second body is less than the threshold, the torque of attraction force is greater than the torque of the repulsion force, thereby controlling the flexible display to be automatically switched from the half-folded state to the folded state, which does not require manual effort from the user. When the angle between the first body and the second body is greater than the threshold, the torque of attraction force is less than the torque of the repulsion force, thereby controlling the flexible display to be automatically switched from the half-folded state to the unfolded state, which does not require manual effort from the user. Therefore, the first magnetic components and the second magnetic components can provide assistance during the folding and unfolding process of the terminal, and avoid the problem that the user needs to exert force in the whole process when the terminal is folded or unfolded through the mechanical structure such as the rotating shaft, thereby improving the user experience.

The positions of the two magnets in each set of magnetic components are opposite to each other, such that the terminal can be controlled to be folded or unfolded in the direction of the side edges.

A magnetic isolation sheet is disposed between the two magnets in each set of magnetic components, such that the magnetic induction line can be gathered, thereby increasing the magnetic force between the two magnets.

By providing at least one set of third magnetic components, the flexible display can be switched from an unfolded state to a complete unfolded state for user convenience.

Figure 10:
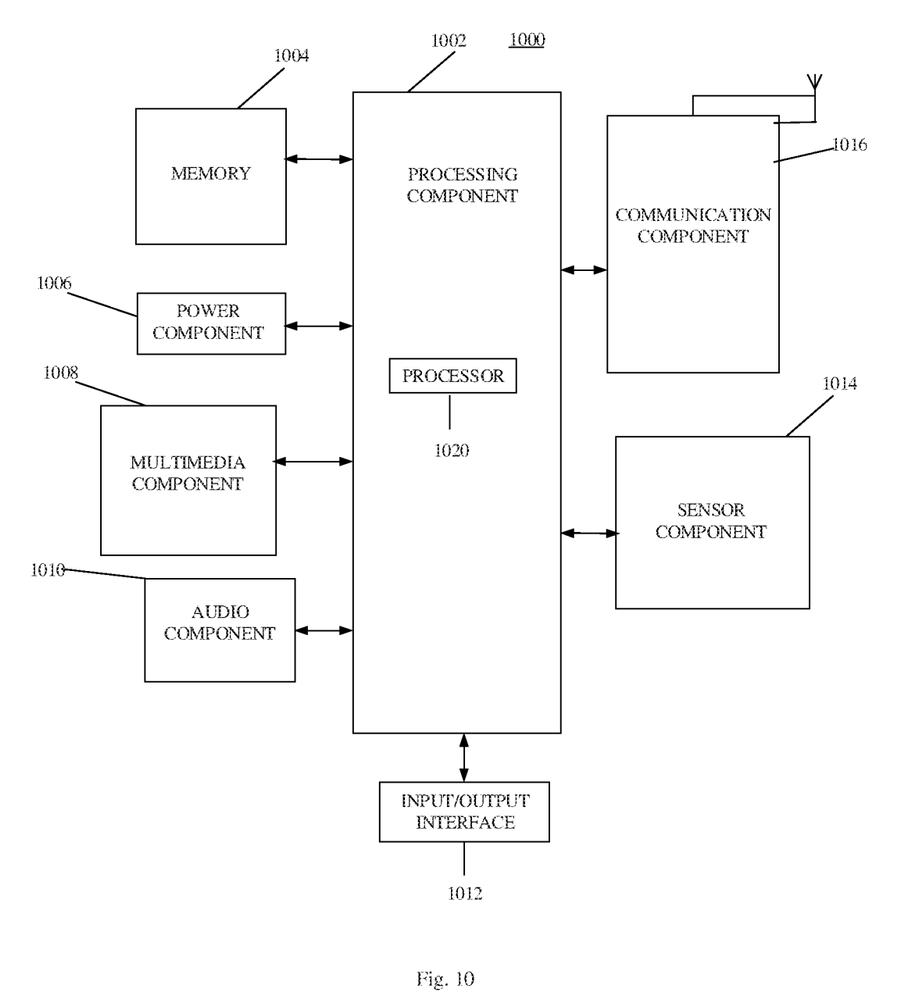
FIG. 10 is a block diagram of a foldable terminal according to an exemplary embodiment.

FIG. 10 is a block diagram of a foldable terminal 1000 according to an exemplary embodiment. For example, the terminal 1000 may be a mobile phone, a computer, a digital broadcast terminal, a messaging device, a gaming console, a tablet, a medical device, exercise equipment, a personal digital assistant, and the like.

Referring to FIG. 10, the terminal 1000 may include one or more of the following components: a processing component 1002, a memory 1004, a power component 1006, a multimedia component 1008, an audio component 1010, an input/output (I/O) interface 1012, a sensor component 1014, and a communication component 1016.

The processing component 1002 typically controls overall operations of the terminal 1000, such as the operations associated with display, telephone calls, data communications, camera operations, and recording operations. The processing component 1002 may include one or more processors 1020 to execute instructions. Moreover, the processing component 1002 may include one or more modules which facilitate the interaction between the processing component 1002 and other components. For instance, the processing component 1002 may include a multimedia module to facilitate the interaction between the multimedia component 1008 and the processing component 1002.

The memory 1004 is configured to store various types of data to support the operation of the terminal 1000. Examples of such data include instructions for any applications or methods operated on the terminal 1000, contact data, phonebook data, messages, pictures, video, etc. The memory 1004 may be implemented using any type of volatile or non-volatile memory devices, or a combination thereof, such as a static random access memory (SRAM), an electrically erasable programmable read-only memory (EEPROM), an erasable programmable read-only memory (EPROM), a programmable read-only memory (PROM), a read-only memory (ROM), a magnetic memory, a flash memory, a magnetic or optical disk.

The power component 1006 provides power to various components of the terminal 1000. The power component 1006 may include a power management system, one or more power sources, and any other components associated with the generation, management, and distribution of power in the terminal 1000.

The multimedia component 1008 includes a screen providing an output interface between the terminal 1000 and the user. The screen may be implemented as a flexible display. In some embodiments, the screen may include a liquid crystal display (LCD) and a touch panel (TP). If the screen includes the touch panel, the screen may be implemented as a touch screen to receive input signals from the user. The touch panel includes one or more touch sensors to sense touches, swipes, and gestures on the touch panel. The touch sensors may not only sense a boundary of a touch or swipe action, but also sense a period of time and a pressure associated with the touch or swipe action. In some embodiments, the multimedia component 1008 includes a front camera and/or a rear camera. The front camera and/or the rear camera may receive an external multimedia datum while the terminal 1000 is in an operation mode, such as a photographing mode or a video mode. Each of the front camera and the rear camera may be a fixed optical lens system or have focus and optical zoom capability.

The audio component 1010 is configured to output and/or input audio signals. For example, the audio component 1010 includes a microphone ("MIC") configured to receive an external audio signal when the terminal 1000 is in an operation mode, such as a call mode, a recording mode, and a voice recognition mode. The received audio signal may be further stored in the memory 1004 or transmitted via the communication component 1016. In some embodiments, the audio component 1010 further includes a speaker to output audio signals.

The I/O interface 1012 provides an interface between the processing component 1002 and peripheral interface modules, such as a keyboard, a click wheel, buttons, and the like.

The buttons may include, but are not limited to, a home button, a volume button, a starting button, and a locking button.

The sensor component 1014 includes one or more sensors to provide status assessments of various aspects of the terminal 1000. For instance, the sensor component 1014 may detect an open/closed status of the terminal 1000, relative positioning of components, e.g., the display and the keypad, of the terminal 1000, a change in position of the terminal 1000 or a component of the terminal 1000, a presence or absence of user contact with the terminal 1000, an orientation or an acceleration/deceleration of the terminal 1000, and a change in temperature of the terminal 1000. The sensor component 1014 may include a proximity sensor configured to detect the presence of nearby objects without any physical contact. The sensor component 1014 may also include a light sensor, such as a CMOS or CCD image sensor, for use in imaging applications. In some embodiments, the sensor component 1014 may also include an accelerometer sensor, a gyroscope sensor, a magnetic sensor, a pressure sensor, or a temperature sensor.

The communication component 1016 is configured to facilitate communication, wired or wirelessly, between the terminal 1000 and other devices. The terminal 1000 can access a wireless network based on a communication standard, such as WiFi, 2G, or 3G, or a combination thereof. In one exemplary embodiment, the communication component 1016 receives a broadcast signal or broadcast associated information from an external broadcast management system via a broadcast channel. In one exemplary embodiment, the communication component 1016 further includes a near field communication (NFC) module to facilitate short-range communications. For example, the NFC module may be implemented based on a radio frequency identification (RFID) technology, an infrared data association (IrDA) technology, an ultra-wideband (UWB) technology, a Bluetooth (BT) technology, and other technologies.

In exemplary embodiments, the terminal 1000 may be implemented with one or more application specific integrated circuits (ASICs), digital signal processors (DSPs), digital signal processing devices (DSPDs), programmable logic devices (PLDs), field programmable gate arrays (FPGAs), controllers, micro-controllers, microprocessors, or other electronic components.

In exemplary embodiments, there is also provided a non-transitory computer-readable storage medium including instructions, such as included in the memory 1004, executable by the processor 1020 in the terminal 1000, for performing applications. For example, the non-transitory computer-readable storage medium may be a ROM, a RAM, a CD-ROM, a magnetic tape, a floppy disc, an optical data storage device, and the like.

Other embodiments of the disclosure will be apparent to those skilled in the art from consideration of the specification and practice of the disclosure disclosed here. This application is intended to cover any variations, uses, or adaptations of the disclosure following the general principles thereof and including such departures from the present disclosure as come within known or customary practice in the art. It is intended that the specification and examples be considered as exemplary only, with a true scope and spirit of the disclosure being indicated by the following claims.

It will be appreciated that the present disclosure is not limited to the exact construction that has been described above and illustrated in the accompanying drawings, and that various modifications and changes may be made without departing from the scope thereof. It is intended that the scope of the disclosure only be limited by the appended claims.

What is claimed is:

1. A foldable terminal, comprising:
   a main body including a first body, a second body, and a rotating shaft connecting the first body and the second body;
   a flexible display fixed to one side of the main body; and
   at least one set of first magnetic components including a first magnet and a second magnet that are attracted to each other,
   wherein the first magnet is disposed on a side of the first body distal from the rotating shaft, the second magnet is disposed on a side of the second body distal from the rotating shaft; and when the flexible display is in a folded state, positions of the first magnet and the second magnet in each set of first magnetic components are opposite to each other;
   when an angle between the first body and the second body is less than a threshold, an attraction force between the first magnet and the second magnet controls the flexible display to switch from a half-folded state to the folded state,
   the foldable terminal further comprising at least one set of second magnetic components including a third magnet and a fourth magnet that are attracted to each other,
   wherein the third magnet is disposed on a side of the first body opposite to the flexible display and proximate to the rotating shaft, and the fourth magnet is disposed on a side of the second body opposite to the flexible display and proximate to the rotating shaft; when the flexible display is in a complete unfolded state, positions of the third magnet and the fourth magnet in each set of second magnetic components are opposite to each other; and
   when the flexible display is in the unfolded state, the flexible display is switched from the unfolded state to the complete unfolded state under control of a torque of an attraction force between the third magnet and the fourth magnet.

2. The terminal according to claim 1, further comprising:
   at least one set of third magnetic components including a fifth magnet and a sixth magnet that are repulsive to each other,
   wherein the fifth magnet is disposed on a side of the first body proximate to the rotating shaft, the sixth magnet is disposed on a side of the second body proximate to the rotating shaft, and when the flexible display is in the folded state, positions of the fifth magnet and the sixth magnet are in an overlapping positional relationship;
   when the angle between the first body and the second body is less than the threshold, a torque of the attraction force between the first magnet and the second magnet is greater than a torque of a repulsion force between the fifth magnet and the sixth magnet, and the flexible display is switched from the half-folded state to the folded state; and
   when the angle between the first body and the second body is greater than the threshold, the torque of the attraction force is less than the torque of the repulsion force, and the flexible display is switched from the half-folded state to the unfolded state.

3. The terminal according to claim 1, wherein a magnetic isolation sheet is disposed between the third magnet and the fourth magnet in each set of the second magnetic components, and the magnetic isolation sheet is configured to gather magnetic induction lines.

4. The terminal according to claim 1, wherein:
a magnetic isolation sheet is disposed between the first magnet and the second magnet in each set of the first magnetic components; and
the magnetic isolation sheet is configured to gather magnetic induction lines.

5. The terminal according to claim 2, wherein:
a magnetic isolation sheet is disposed between the fifth magnet and the sixth magnet in each set of the third magnetic components; and
the magnetic isolation sheet is configured to gather magnetic induction lines.

6. The terminal according to claim 1, wherein the main body comprises one first body and one second body, sizes of the first body and the second body being equal.

7. The terminal according to claim 1, wherein the main body comprises two first bodies, the two first bodies being respectively disposed at both ends of the second body.

8. The terminal according to claim 7, wherein a sum of sizes of the two first bodies is equal to a size of the second body.

9. The terminal according to claim 8, wherein each of the two first bodies has a size half of the size of the second body.

* * * * *